US010630275B2

(12) United States Patent
Chan

(10) Patent No.: US 10,630,275 B2
(45) Date of Patent: Apr. 21, 2020

(54) CONSTANT-ON-TIME PULSE GENERATOR CIRCUIT FOR A DC-DC CONVERTER

(71) Applicant: NXP B.V., Eindhoven (NL)

(72) Inventor: Shufan Chan, Milpitas, CA (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/905,762

(22) Filed: Feb. 26, 2018

(65) Prior Publication Data

US 2019/0267981 A1    Aug. 29, 2019

(51) Int. Cl.
| | |
|---|---|
| H03K 7/08 | (2006.01) |
| H02M 1/08 | (2006.01) |
| H02M 3/158 | (2006.01) |
| H03K 5/06 | (2006.01) |
| H03K 5/13 | (2014.01) |
| H03K 7/06 | (2006.01) |
| H02M 3/157 | (2006.01) |
| H02M 1/00 | (2006.01) |
| G04F 10/10 | (2006.01) |

(52) U.S. Cl.
CPC ............. *H03K 7/08* (2013.01); *H02M 1/08* (2013.01); *H02M 3/158* (2013.01); *H03K 5/06* (2013.01); *H03K 5/13* (2013.01); *H03K 7/06* (2013.01); *G04F 10/10* (2013.01); *H02M 3/157* (2013.01); *H02M 2001/0025* (2013.01)

(58) Field of Classification Search
CPC ........... H03K 7/08; H02M 1/08; H02M 3/158
USPC ........ 327/172–176, 291, 293–296, 298, 299; 323/272, 282–285
See application file for complete search history.

(56) References Cited

U.S. PATENT DOCUMENTS

| | | | |
|---|---|---|---|
| 5,617,452 A  * | 4/1997 | Haulin | G06F 1/10 375/354 |
| 8,446,135 B2 | 5/2013 | Chen et al. | |
| 8,476,882 B2 | 7/2013 | Luo et al. | |
| 8,669,747 B2 | 3/2014 | Fang et al. | |
| 9,559,592 B2 | 1/2017 | Pigott et al. | |
| 9,588,532 B2 | 3/2017 | Rahimi et al. | |
| 2005/0127969 A1* | 6/2005 | Lee | G11C 7/1048 327/175 |

(Continued)

FOREIGN PATENT DOCUMENTS

WO       9819395 A1    5/1998

OTHER PUBLICATIONS

S. Bari, Q. Li and F. C. Lee, "Fast adaptive on time control for transient performance improvement," 2015 IEEE Applied Power Electronics Conference and Exposition (APEC), Charlotte, NC, 2015.

(Continued)

*Primary Examiner* — Tomi Skibinski

(57) ABSTRACT

Embodiments of a constant-on-time pulse generator circuit for a DC-DC converter, a pulse width calibration circuit for a DC-DC converter, and a method for operating a constant-on-time pulse generator circuit for a DC-DC converter are disclosed. In an embodiment, a constant-on-time pulse generator circuit for a DC-DC converter includes serially connected digital buffers and a latch circuit having a set terminal, a reset terminal, and an output terminal. The set terminal and the reset terminal are coupled to the serially connected digital buffers. The latch circuit is configured to output a pulse signal with a constant pulse width through the output terminal.

16 Claims, 7 Drawing Sheets

(56) References Cited

U.S. PATENT DOCUMENTS

| | | | |
|---|---|---|---|
| 2005/0237848 A1* | 10/2005 | Takahashi | G11C 5/145 365/232 |
| 2006/0170478 A1* | 8/2006 | Jung | H03H 11/265 327/276 |
| 2007/0069792 A1* | 3/2007 | Rho | H03H 11/265 327/261 |
| 2008/0042715 A1* | 2/2008 | Sheen | H03K 5/133 327/284 |
| 2008/0224756 A1* | 9/2008 | Prodic | H03K 7/08 327/392 |
| 2008/0238752 A1* | 10/2008 | Shimizu | G04F 10/005 341/155 |
| 2009/0102447 A1 | 4/2009 | Weng et al. | |
| 2010/0013307 A1* | 1/2010 | Heineman | G06F 1/26 307/33 |
| 2011/0080200 A1* | 4/2011 | Zhou | H03K 3/64 327/172 |
| 2011/0128057 A1* | 6/2011 | Chen | H03L 7/0805 327/158 |
| 2011/0291727 A1* | 12/2011 | Kim | H03H 11/265 327/237 |
| 2012/0153917 A1 | 6/2012 | Adell et al. | |
| 2013/0154698 A1* | 6/2013 | Bottelli | H03L 7/07 327/157 |
| 2013/0249508 A1 | 9/2013 | Rahimi et al. | |
| 2013/0249517 A1* | 9/2013 | Shiraishi | G05F 1/468 323/283 |
| 2017/0025952 A1 | 1/2017 | Huang | |
| 2017/0126124 A1 | 5/2017 | Santoro et al. | |
| 2017/0194862 A1 | 7/2017 | Guo | |
| 2017/0324325 A1 | 11/2017 | Wang | |
| 2018/0083456 A1 | 3/2018 | Huang et al. | |

OTHER PUBLICATIONS

Liu, Pei-Hsin et al; "Modeling and Autotuning of AVP Control with Inductor DCR Current Sensing"; IEEE 2014 Applied Power Electronics Conference and Exposition; pp. 1066-1072 (2014).

European Patent Appln. No. 19154930.2 Extended European Search Report dated Jul. 10, 2019, 8 pages.

* cited by examiner

CONSTANT-ON-TIME PULSE GENERATOR CIRCUIT FOR A DC-DC CONVERTER

BACKGROUND

A DC-DC converter converts a direct current (DC) power source from one voltage level to another. A DC-DC converter may be, for example, a Buck DC-DC converter in which the input voltage is higher than the output voltage, a Boost DC-DC converter in which the input voltage is lower than the output voltage, or a Buck-Boost DC-DC converter in which the input voltage is higher or lower than the output voltage. Constant on-time voltage regulators, such as buck DC-DC converters, boost DC-DC converters, or buck-boost DC-DC converters, are known for their fast transient responses, ease of design, and smaller and simpler controllers.

However, a typical constant-on-time pulse generator uses analog circuits for pulse signal generation. However, analog circuits may not work well with a DC-DC converter that switches at a high frequency. For example, a constant-on-time pulse generator may use a ramp generator and a comparator with a fixed threshold to generate a pulse signal with a fixed pulse width. However, because of the comparator's finite propagation delay, the constant-on-time pulse generator does not work well when the DC-DC converter switches at a high frequency. Specifically, because of the comparator's finite propagation delay, the constant-on-time pulse generator may not able to generate a pulse signal with a pulse width that is narrow enough for the high switching frequency of the DC-DC converter.

SUMMARY

Embodiments of a constant-on-time pulse generator circuit for a DC-DC converter, a pulse width calibration circuit for a DC-DC converter, and a method for operating a constant-on-time pulse generator circuit for a DC-DC converter are disclosed. In an embodiment, a constant-on-time pulse generator circuit for a DC-DC converter includes serially connected digital buffers and a latch circuit having a set terminal, a reset terminal, and an output terminal. The set terminal and the reset terminal are coupled to the serially connected digital buffers. The latch circuit is configured to output a pulse signal with a constant pulse width through the output terminal. Other embodiments of the constant-on-time pulse generator circuit are also described.

In an embodiment, the serially connected digital buffers are configured to delay a trigger signal for the constant-on-time pulse generator circuit with a predefined delay duration.

In an embodiment, the serially connected digital buffers are configured to delay a trigger signal for the constant-on-time pulse generator circuit with the predefined delay duration in response to a voltage control signal or a current control signal.

In an embodiment, the constant-on-time pulse generator circuit further includes a controller configured to select an output of one of the serially connected digital buffers as an output of the serially connected digital buffers.

In an embodiment, the controller includes a multiplexer configured to enable or disable one or more digital buffers of the digital buffers.

In an embodiment, the controller further includes a counter configured to generate a digital word, and the multiplexer is further configured to enable or disable one or more digital buffers of the digital buffers based on the digital word.

In an embodiment, the latch circuit is configured to receive a trigger signal for the constant-on-time pulse generator circuit and the output of the serially connected digital buffers.

In an embodiment, the latch circuit is configured to receive a trigger signal at the set terminal and to receive the output of the serially connected digital buffers at the reset terminal.

In an embodiment, the serially connected digital buffers are identical to each other.

In an embodiment, a pulse width calibration circuit for a DC-DC converter includes a master constant-on-time pulse generator circuit configured to generate a pulse signal with a constant pulse width, a pulse width to voltage converter configured to generate an output voltage in response to the pulse signal, an amplifier configured to generate an amplified voltage in response to the output voltage, and a filter configured to perform signal filtering on the amplified voltage to generate a control voltage signal for the master constant-on-time pulse generator circuit in response to the amplified voltage.

In an embodiment, the master constant-on-time pulse generator circuit includes serially connected digital buffers and a latch circuit having a set terminal, a reset terminal, and an output terminal. The set terminal and the reset terminal are coupled to the serially connected digital buffers. The latch circuit is configured to output the pulse signal with the constant pulse width through the output terminal.

In an embodiment, the serially connected digital buffers are configured to delay a trigger signal with a predefined delay duration in response to the control voltage signal.

In an embodiment, the latch circuit is configured to receive a trigger signal at the set terminal and to receive the output of the serially connected digital buffers at the reset terminal.

In an embodiment, the serially connected digital buffers are identical to each other.

In an embodiment, the amplifier is further configured to compare the output voltage to a reference voltage and generate the amplified voltage based on a difference between the output voltage and the reference voltage.

In an embodiment, a method for operating a constant-on-time pulse generator circuit for a DC-DC converter involves delaying a trigger signal using serially connected digital buffers of the constant-on-time pulse generator circuit and generating a pulse signal with a constant pulse width in response to the delayed trigger signal using a latch circuit of the constant-on-time pulse generator circuit.

In an embodiment, the latch circuit includes a set terminal, a reset terminal, and an output terminal. The set terminal and the reset terminal are coupled to the serially connected digital buffers.

In an embodiment, delaying the trigger signal using the serially connected digital buffers of the constant-on-time pulse generator circuit involves selecting an output of one of the serially connected digital buffers as an output of the serially connected digital buffers.

In an embodiment, selecting the output of the one of the serially connected digital buffers as the output of the serially connected digital buffers involves generating a digital word and enabling or disabling one or more digital buffers of the digital buffers based on the digital word.

In an embodiment, the serially connected digital buffers are identical to each other.

Other aspects in accordance with the invention will become apparent from the following detailed description,

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Figure 1:
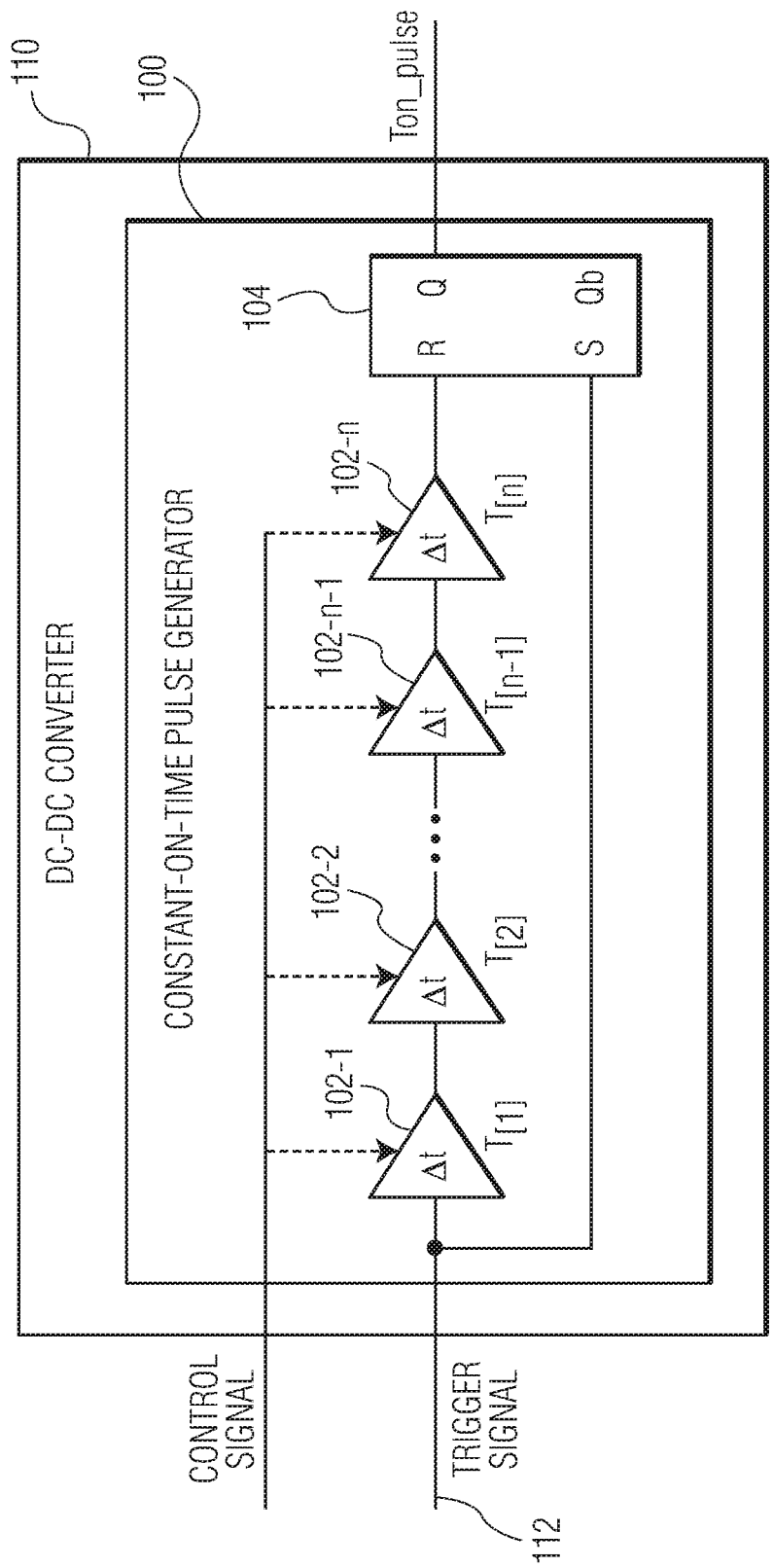
FIG. 1 is a schematic block diagram of a constant-on-time pulse generator for a DC-DC converter in accordance with an embodiment of the invention.

FIG. 1 is a schematic block diagram of a constant-on-time pulse generator 100 for a DC-DC converter 110 in accordance with an embodiment of the invention. In the embodiment depicted in FIG. 1, the constant-on-time pulse generator includes serially connected digital buffers 102-1, 102-2, ..., 102-n (where n is an integer greater than one) and a latch circuit 104. The constant-on-time pulse generator can be used to provide timing signals for the DC-DC converter. Using the constant-on-time pulse generator, an active and inactive cycle is provided for the DC-DC converter such that a defined on time is generated. In some embodiments, the constant-on-time pulse generator generates a timing signal with a constant on time (i.e., a timing signal in which the time duration of an active portion of the waveform is constant). The DC-DC converter may be a Buck DC-DC converter in which the input voltage is higher than the output voltage, a Boost DC-DC converter in which the input voltage is lower than the output voltage, or a Buck-Boost DC-DC converter in which the input voltage is higher or lower than the output voltage. Although the constant-on-time pulse generator is shown in FIG. 1 as including certain components, in some embodiments, the constant-on-time pulse generator includes less or more components to implement less or more functionalities.

A typical constant-on-time pulse generator uses analog circuits to generate pulse signals. However, analog circuits may not work well with a DC-DC converter that switches at a high frequency. For example, a constant-on-time pulse generator can use a ramp generator and a comparator with a fixed threshold to generate a pulse signal with a fixed pulse width. However, because of the comparator's finite propagation delay, the constant-on-time pulse generator does not work well when the DC-DC converter switches at a high frequency. For example, because of the comparator's finite propagation delay, the constant-on-time pulse generator may not able to generate a pulse signal with a pulse width that is narrow enough for the high switching frequency of the DC-DC converter. Compared to a constant-on-time pulse generator that uses analog circuits to generate pulse signals, the constant-on-time pulse generator 100 depicted in FIG. 1 uses digital circuits that can generate a pulse signal with a pulse width that is narrow enough (e.g., 100 nanoseconds or less) for a high switching frequency of the DC-DC converter 110.

Referring to FIG. 1, the digital buffers 102-1, 102-2, ..., 102-n are serially connected and configured to generate delay. In the embodiment depicted in FIG. 1, the serially connected digital buffers are configured to delay a trigger signal 112 for the constant-on-time pulse generator circuit with a predefined delay duration. In particular, the digital buffer 102-1 receives the trigger signal and generates a delay, "$T_{[1]}$," the digital buffer 102-2 generates a delay, "$T_{[2]}$," the digital buffer 102-n-1 generates a delay, "$T_{[n-1]}$," and the digital buffer 102-n generates a delay, "$T_{[n]}$." In some embodiments, at least one of the digital buffers is implemented by a digital gate that is biased with a current/voltage. In these embodiments, a gate propagation delay is a function of the bias current/voltage and the delay duration can be controlled by changing the bias current/voltage. In some other embodiments, at least one of the digital buffers is implemented by a Resistor-Capacitor (RC) network connected between two digital gates. In these embodiments, the RC network creates the delay that can be varied by changing, for example, the resistance value of the resistor of the RC network, and the digital gates perform input/output buffering. In some embodiments, the digital buffers are identical to each other and each digital buffer generates a delay with an identical time duration. In some embodiments, a control signal, which can be a current control signal or a voltage control signal (V_control), is used to control the delay duration of the digital buffers. In some embodiments, the constant-on-time pulse generator 100 includes a controller (not shown in FIG. 1) configured to control (e.g., enable or disable) one or more of the digital buffers. In an embodiment, the controller is configured to select an output of one of the serially connected digital buffers as an output of the serially connected digital buffers. The controller may be implemented using one or more digital circuits. In some embodiments, the controller is implemented using a processor such as a microcontroller or a central processing unit (CPU).

In the embodiment depicted in FIG. 1, the latch circuit 104 includes a set terminal, "S," a reset terminal, "R," and an output terminal, "Q." The set terminal, S, and the reset terminal, R, are coupled to the serially connected digital buffers 102-1, 102-2, . . . , 102-N. In some embodiments, the latch circuit is configured to receive the trigger signal 112 at the set terminal, S, and the output of the serially connected digital buffers at the reset terminal, R. The latch circuit is configured to output a pulse signal, "Ton_pulse," with a constant pulse width through the output terminal, Q. The latch circuit, which is also referred to as a flip-flop, may be implemented as various types of latch circuits. In some embodiments, the latch circuit is implemented as a set-reset (SR) latch, which may be a SR NOR latch that includes a pair of cross-coupled NOR gates, a SR NAND latch that includes a pair of NAND gates, or a SR AND-OR latch that includes a NOR gate and an AND gate. In addition to the set terminal, S, the reset terminal, R, and the output terminal, Q, the latch circuit may include a complement output terminal, "Qb," which can be used to output the complement value of the output at the output terminal, Q.

Figure 2:
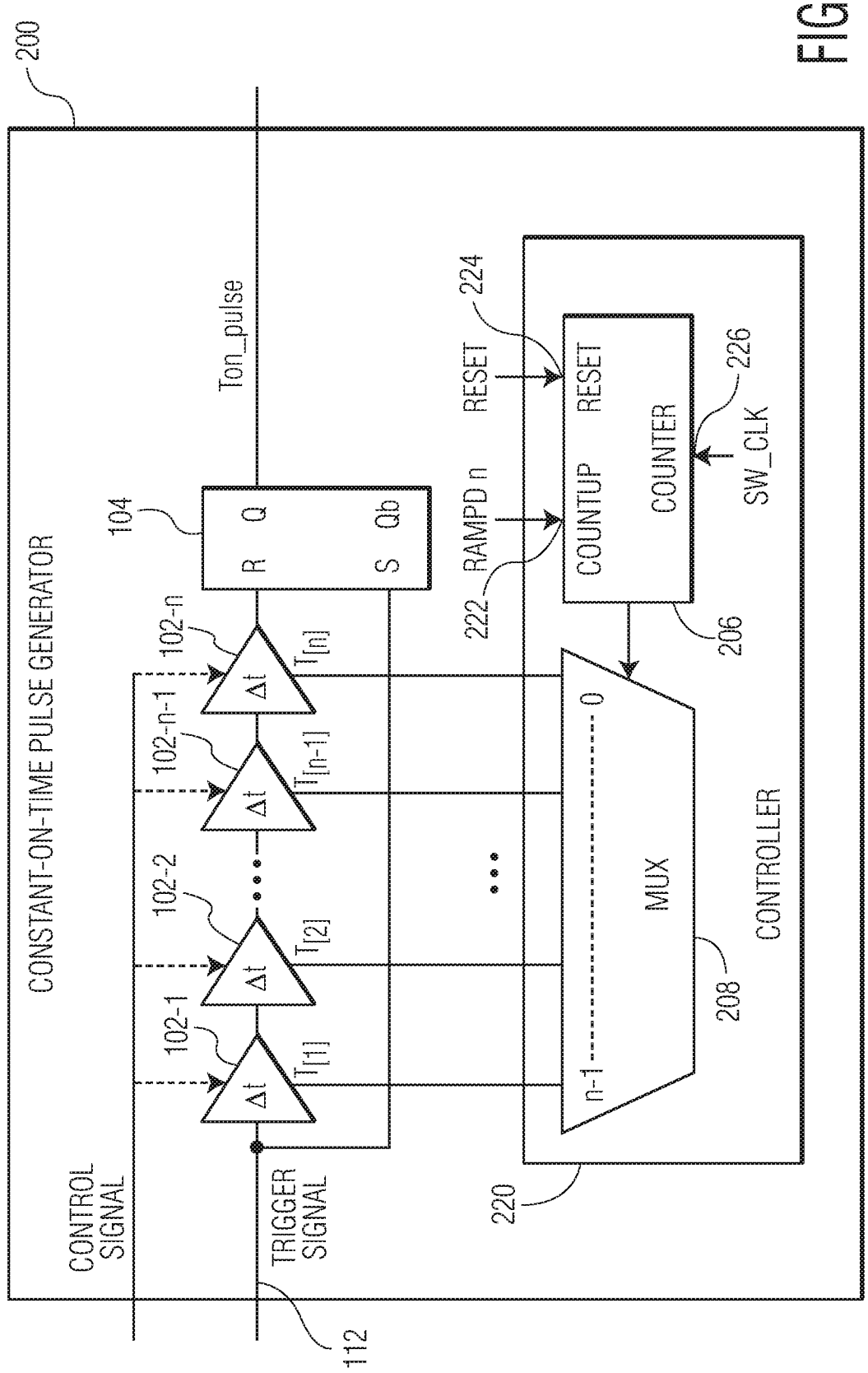
FIG. 2 depicts an embodiment of a constant-on-time pulse generator.

FIG. 2 depicts an embodiment of a constant-on-time pulse generator 200. In the embodiment depicted in FIG. 2, the constant-on-time pulse generator 200 includes the serially connected digital buffers 102-1, 102-2, . . . , 102-n, the latch circuit 104, and a controller 220 configured to control (e.g., enable or disable) one or more digital buffers of the serially connected digital buffers. In an embodiment, the controller is configured to select an output of one of the serially connected digital buffers as an output of the serially connected digital buffers. The constant-on-time pulse generator 200 depicted in FIG. 2 is one possible embodiment of the constant-on-time pulse generator 100 depicted in FIG. 1. However, the constant-on-time pulse generator depicted in FIG. 1 is not limited to the embodiment shown in FIG. 2.

The controller 220 can control the delay generated by the serially connected digital buffers 102-1, 102-2, . . . , 102-n in discrete steps. Consequently, the controller can increase (ramp up) or decrease (ramp down) of the pulse width, "Ton," of the pulse signal, Ton_pulse, in discrete steps. In the embodiment depicted in FIG. 2, the controller includes a counter 206 configured to generate a digital word with n bit(s) and an n-bit multiplexer 208 configured to enable or disable one or more digital buffers of the digital buffers in response to the digital word. The counter may receive a RampDn signal at a "CountUP" terminal 222, a reset signal at a "Reset" terminal 224, and a clock signal, "SW_CLK" at a clock terminal 226. In some embodiments, the multiplexer enables one of the digital buffers and disables the rest of the digital buffers. In some embodiments, the controller may be implemented using electrical circuits such as one or more switches.

Figure 3:
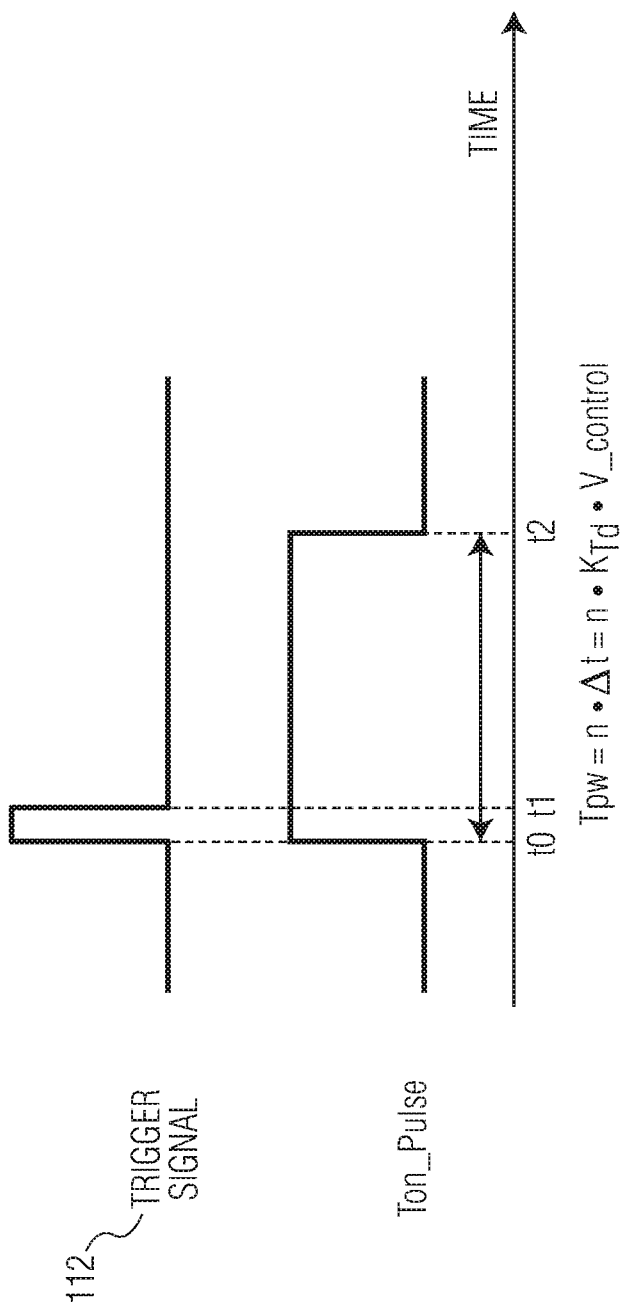
FIG. 3 is a timing diagram of a trigger signal of the constant-on-time pulse generator depicted in FIG. 2 and a pulse signal generated by the constant-on-time pulse generator depicted in FIG. 2.

FIG. 3 is a timing diagram of the trigger signal 112 and the pulse signal, Ton_pulse, generated by the constant-on-time pulse generator 200. As illustrated in the FIG. 3, the trigger signal has a rising signal edge at time point, "$t_0$," and a falling signal edge at time point, "$t_1$." At time point, $t_0$, the pulse signal, Ton_pulse, has a rising signal edge and at time point, "$t_2$," the pulse signal, Ton_pulse, has a falling signal edge. The pulse width, Ton, of the pulse signal, Ton_pulse, can be expressed as:

$$T_{on} = M \times \Delta t, \qquad (1)$$

where M is an integer that is digitally programmable by the counter 206. The pulse width, Ton, of the pulse signal, Ton_pulse, can also be expressed as:

$$T_{on} = M \times K_{TD} \times V\_control, \qquad (2)$$

where $K_{TD}$ represents a delay coefficient and V_control represents the control voltage for the digtial buffers 102-1, 102-2, . . . , 102-n.

Figure 4:
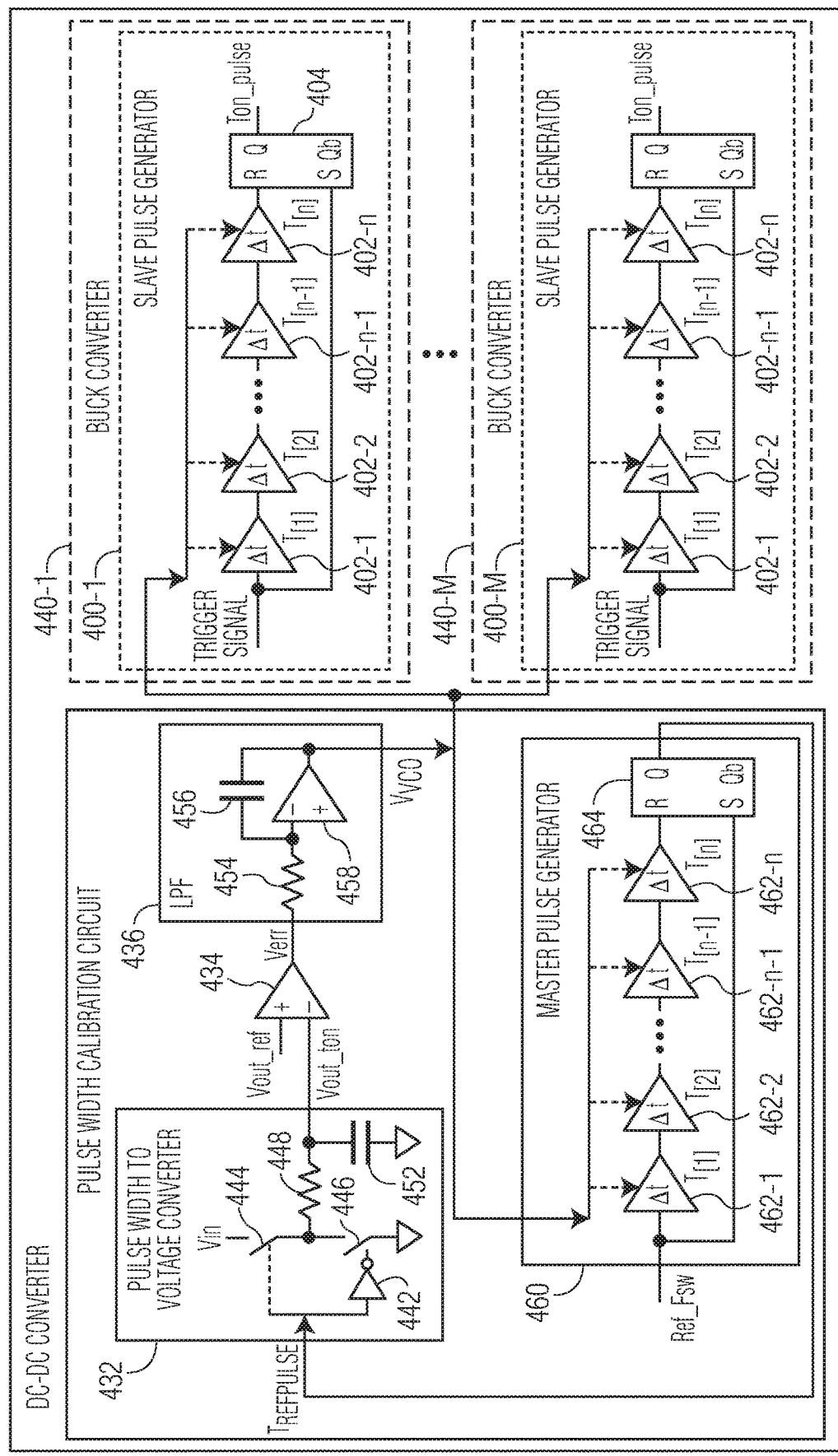
FIG. 4 depicts an embodiment of a pulse width calibration circuit that can be used for pulse width calibration of one or more constant-on-time pulse generators.

FIG. 4 depicts an embodiment of a pulse width calibration circuit 430 that can be used for pulse width calibration of one or more constant-on-time pulse generators 400-1, . . . , 400-M (M being an integer that is greater than zero). Each constant-on-time pulse generator may be used for a different voltage converter. In some embodiments, a multi-phase DC-DC converter 410 includes the pulse width calibration circuit and multiple buck converters 440-1, . . . , 440-M. In these embodiments, each buck converter includes a corresponding constant-on-time pulse generator. The constant-on-time pulse generators 400-1, . . . , 400-M depicted in FIG. 4 are possible embodiments of the constant-on-time pulse generator 100 depicted in FIG. 1. However, the constant-on-time pulse generator depicted in FIG. 1 is not limited to the embodiment shown in FIG. 4.

In the embodiment depicted in FIG. 4, the pulse width calibration circuit 430 includes a pulse width to voltage converter 432, an amplifier 434, a low-pass filter (LPF) 436, and a master constant-on-time pulse generator 460 (referred as the master pulse generator). The master pulse generator is configured to generate a pulse signal, "$T_{REFPULSE}$," in response to a reference switching frequency, "Ref_Fsw," of the DC-DC converter 410. The pulse width to voltage converter is configured to generate an output voltage, "Vout_ton," which is the average DC voltage of a pulse sequence, in response to the pulse signal, $T_{REFPULSE}$. The amplifier, which may be an error amplifier, is configured to compare the voltage, Vout_ton, that is generated by the pulse width to voltage converter, and a reference voltage, "Vout_ref," which is the desired output voltage for the DC-DC converter, to generate an output voltage, "Verr," which is an amplified version of the voltage difference between the voltage, Vout_ref, and the voltage, Vout_ton. The LPF is configured to perform signal filtering to generate a control voltage, "Vvco," for multi-tap delay lines inside the master pulse generator based on the voltage, Verr, from the amplifier.

In the embodiment depicted in FIG. 4, the pulse width to voltage converter 432 includes an inverter 442, switches 444, 446, a resistor 448 that is connected between the switches, and a capacitor 452. The switches 444, 446 may be connected between a voltage, "Vin," which is the input voltage of the DC-DC converter 410, and a reference voltage, such as ground. The switch 446 and the capacitor may be connected to the reference voltage.

In the embodiment depicted in FIG. 4, the LPF 436 includes a resistor 454 at which the output voltage, Verr, of the amplifier 434 is applied, a capacitor 456, and an amplifier 458 configured to generate the control voltage, Vvco. In some embodiments, the amplifier is an error amplifier.

In the embodiment depicted in FIG. 4, the master pulse generator 460 includes serially connected digital buffers 462-1, 462-2, ..., 402-n (where n is an integer greater than one) and a latch circuit 464. The master pulse generator 460 depicted in FIG. 4 is one possible embodiment of the constant-on-time pulse generator 100 depicted in FIG. 1. However, the constant-on-time pulse generator depicted in FIG. 1 is not limited to the embodiment shown in FIG. 4.

In the embodiment depicted in FIG. 4, the constant-on-time pulse generators 400-1, ..., 400-M are slave pulse generators that are connected to the master pulse generator 460 and that are driven by the same control signal as the master pulse generator. Each slave pulse generator includes serially connected digital buffers 602-1, 602-2, ..., 602-n (where n is an integer greater than one) and a latch circuit 604. The pulse width calibration circuit 430 provides a common control voltage, Vvco, to each slave pulse generator such that the pulse width of the pulse signal generated by each slave pulse generator is the same as the pulse width of the pulse signal generate by the master pulse generator. In some embodiments, each slave generator may be identical to the master constant-on-time pulse generator. In these embodiments, with the same controlled voltage, each multi-tap controlled delay line within the master pulse generator or a slave pulse generator has the same delay duration. Having the same delay duration, the master pulse generator and each slave pulse generator generate pulse signals having the same pulse width. In an example operation of the pulse width calibration circuit, at a steady state, the common control voltage, Vvco, converges to a constant value and the voltage, Verr, becomes zero, and the master pulse generator generates the pulse signal, $T_{REFPULSE}$, that has a pulse width that is needed by a buck converter to regulate its output voltage for a given reference switching frequency.

In some embodiments, the pulse width of the pulse signal generated by the master pulse generator 460 can be expressed as:

$$T_{on} = K_G \times V_{vco}, \quad (3)$$

where Ton represents the pulse width of the pulse signal, $T_{REFPULSE}$, and $K_G$ represents a conversion factor. The common control voltage, Vvco, which is generated by the LPF 436 can be expressed as:

$$V_{Vco} = K_{LPF} \times V_{err}, \quad (4)$$

where $K_{LPF}$ represents the trasnfer gain of the LPF. The voltage, Vout_ton, which is generated by the pulse width to voltage converter 432, can be expressed as:

$$V_{out\_ton} = V_{in} \times T_{on} \text{Ref\_Fsw}. \quad (5)$$

The output voltage, Verr, of the amplifier 434 can be expressed as:

$$V_{err} = A_{EA} \times (V_{out\_ref} - V_{out\_ton}), \quad (6)$$

where $A_{EA}$ represents the amplfiier gain of the amplifier. Consequently, the output voltage, Verr, of the amplifier 434 can be expressed as:

$$V_{err} = A_{EA} \times (V_{out\_ref} - V_{in} \times T_{on} \times \text{Ref\_Fsw}), \quad (7)$$

As such, the following equation holds true.

$$\frac{V_{Vco}}{K_{LPF} \times K_G} = A_{EA} \times (V_{out\_ref} - V_{in} \times T_{on} \times \text{Ref\_Fsw}). \quad (8)$$

Consequently, the following equation holds true.

$$\frac{V_{Vco}}{K_{LPF} \times K_G \times A_{EA}} = V_{out\_ref} - V_{in} \times T_{on} \times \text{Ref\_Fsw}, \quad (9)$$

When $$\frac{V_{Vco}}{K_{LPF} \times K_G \times A_{EA}}$$

is close to zero, the pulse width Ton of the pulse signal, $T_{REFPULSE}$, generated by the master constant-on-time pulse generator 460 can be expressed as:

$$T_{on} \approx \frac{V_{out\_ref}}{V_{in} \times \text{Ref\_Fsw}}. \quad (10)$$

Consequently, the pulse width, Ton, of the pulse signal, $T_{REFPULSE}$, generated by the master pulse generator 460 can be controlled by adjusting the reference voltage, Vout_out ref, the input voltage, Vin, and/or the reference switching frequency, Ref_Fsw.

Figure 5:
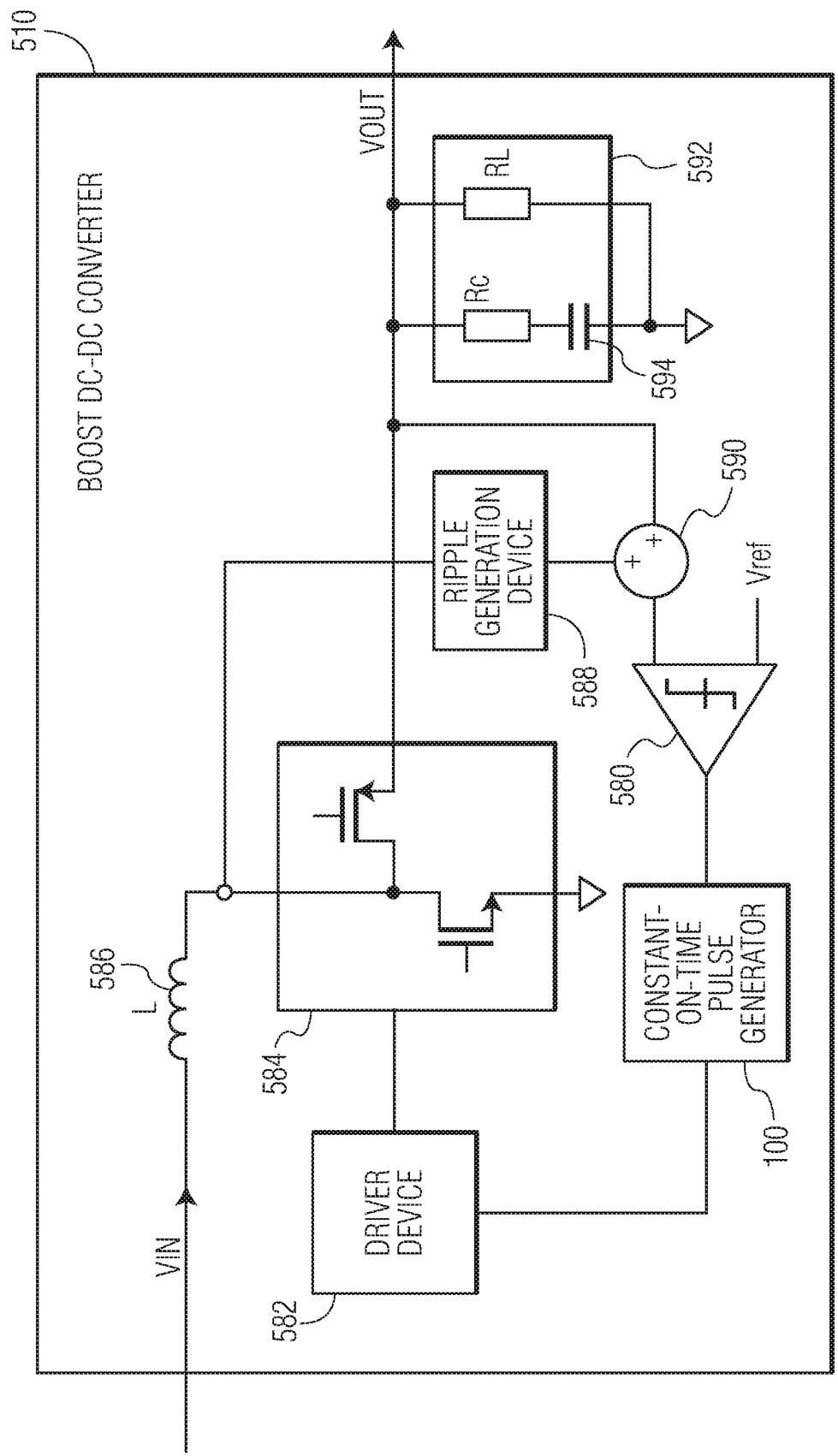
FIG. 5 depicts an embodiment of a boost DC-DC converter in which the constant-on-time pulse generator of FIG. 1 can be used.

FIG. 5 depicts an embodiment of a boost DC-DC converter 510 in which the constant-on-time pulse generator 100 of FIG. 1 can be used. In the embodiment depicted in FIG. 5, the boost DC-DC converter includes the constant-on-time pulse generator, a comparator 580, a driver device 582, a power stage circuit 584 that may includes one or more power field-effect transistors (FETs) (not shown), an inductor 586, a ripple generation device 588, a voltage summation device 590, and an optional RC network 592, which includes a capacitor 594 and resistors RC, RL. The boost constant on-time voltage regulator converts an input voltage, VIN, into an output voltage, VOUT, which is higher than the input voltage, VIN. In the embodiment depicted in FIG. 5, the ripple generation device is configured to generate a ripple signal for the boost DC-DC converter. The voltage summation device is configured to sum up the voltage of the ripple signal that is generated by the ripple generation device with the output voltage, VOUT, of the boost DC-DC converter. The comparator is configured to compare the result from the voltage summation device with a reference voltage, Vref The constant-on-time pulse generator is configured to genera a pulse signal with a fixed pulse width depending on the input voltage from the comparator. The driver device is configured to drive the power stage based on the pulse signal received from the constant-on-time pulse generator. The driver device is a common voltage regulator component, and consequently is not described in detail herein. In some embodiments, the driver device is implemented using at least one processor such as a microcontroller or a CPU. The power stage is configured to convert an input voltage, VIN, received through the inductor into the output voltage, VOUT, of the boost DC-DC converter. The RC network can be used as a load for the boost constant on-time voltage regulator. In some embodiments, the RC network is not a component of the boost constant on-time voltage regulator. Although the boost DC-DC converter is shown in FIG. 5 as including certain components, in some embodiments, the boost DC-DC converter includes less or more components to implement less or more functionalities.

Figure 6:
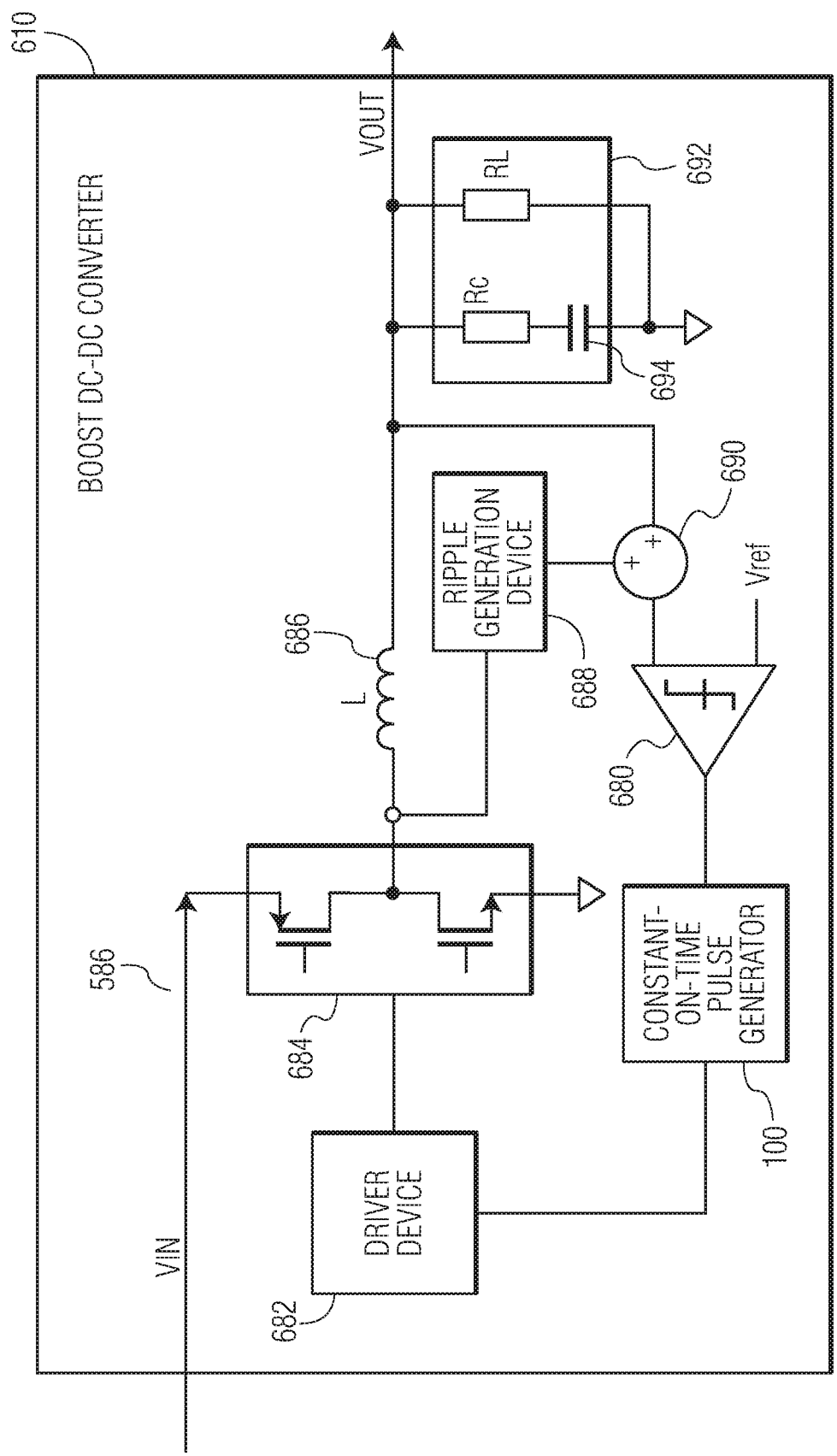
FIG. 6 depicts an embodiment of a buck DC-DC converter in which the constant-on-time pulse generator of FIG. 1 can be used.

FIG. 6 depicts an embodiment of a buck DC-DC converter 610 in which the constant-on-time pulse generator 100 of FIG. 1 can be used. In the embodiment depicted in FIG. 6, the buck DC-DC converter includes the constant-on-time pulse generator, a comparator 680, a driver device 682, a power stage circuit 684 that may include one or more power FETs (not shown), an inductor 686, a ripple generation device 688, a voltage summation device 690, and an optional RC network 692, which includes a capacitor 694 and resistors RC, RL. The buck DC-DC converter converts an input voltage, VIN, into an output voltage, VOUT, which is lower than the input voltage, VIN. In the embodiment depicted in FIG. 6, the ripple generation device is configured to generate a ripple signal for the buck DC-DC converter. The voltage summation device is configured to sum up the voltage of the ripple signal that is generated by the ripple generation device with the output voltage, VOUT, of the buck DC-DC converter. The comparator is configured to compare the result from the voltage summation device with a reference voltage, Vref. The constant-on-time pulse generator is configured to genera a pulse signal with a fixed pulse width depending on the input voltage from the comparator. The driver device is configured to drive the power stage based on the pulse signal received from the constant-on-time pulse generator. The driver device is a common voltage regulator component, and consequently is not described in detail herein. In some embodiments, the driver device is implemented using at least one processor such as a microcontroller or a CPU. The power stage and the inductor are configured to convert an input voltage, VIN, into the output voltage, VOUT, of the buck DC-DC converter. The RC network can be used as a load for the boost constant on-time voltage regulator. In some embodiments, the RC network is not a component of the boost constant on-time voltage regulator. Although the buck DC-DC converter is shown in FIG. 6 as including certain components, in some embodiments, the buck DC-DC converter includes less or more components to implement less or more functionalities.

Figure 7:
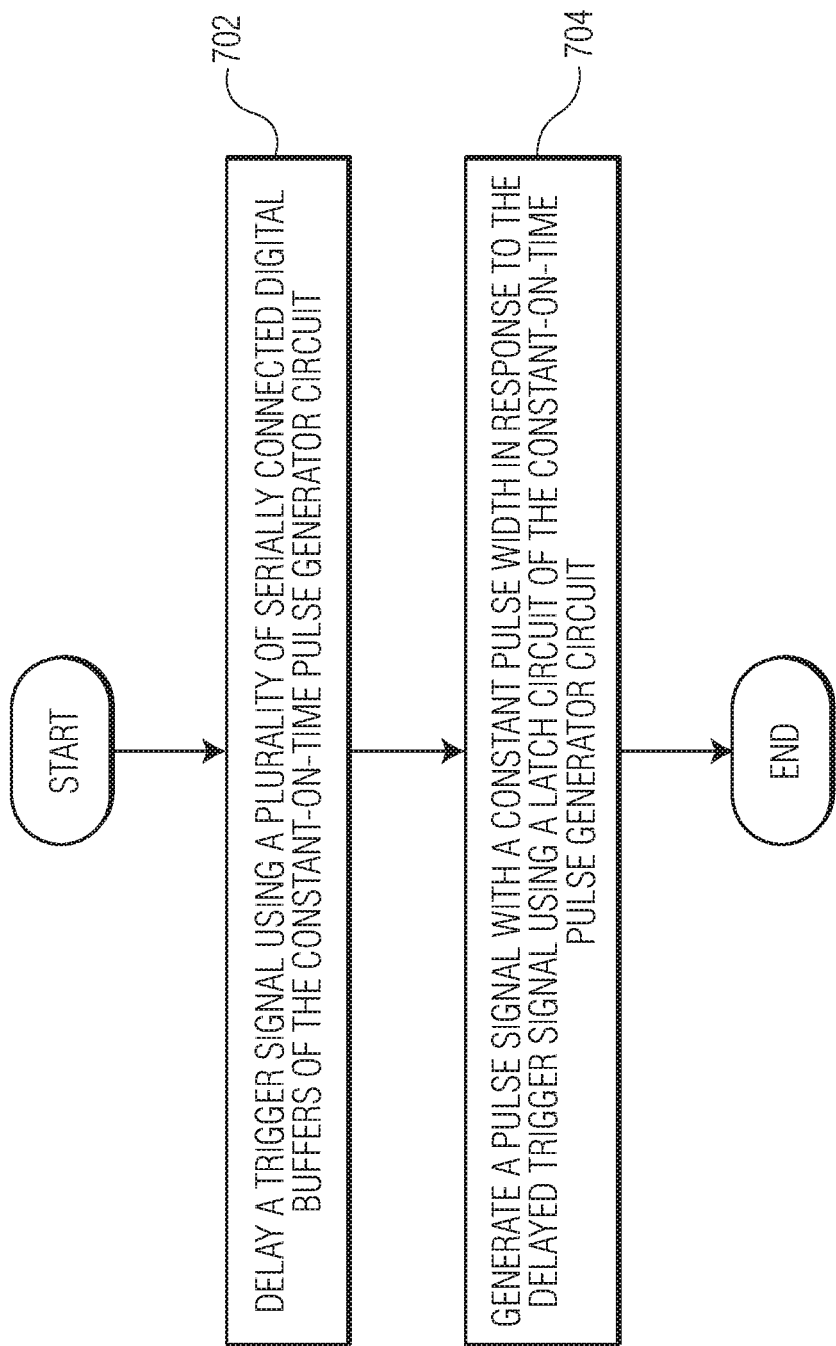
FIG. 7 is a process flow diagram of a method for operating a constant-on-time pulse generator circuit for a DC-DC converter in accordance with an embodiment of the invention.

FIG. 7 is a process flow diagram of a method for operating a constant-on-time pulse generator circuit for a DC-DC converter in accordance with an embodiment of the invention. At block 702, a trigger signal is delayed using serially connected digital buffers of the constant-on-time pulse generator circuit. At block 704, a pulse signal with a constant pulse width is generated in response to the delayed trigger signal using a latch circuit of the constant-on-time pulse generator circuit. The constant-on-time pulse generator circuit may be similar to or the same as the constant-on-time pulse generator 100 depicted in FIG. 1, the constant-on-time pulse generator 200 depicted in FIG. 2, the master constant-on-time pulse generator 460 depicted in FIG. 4, and/or the slave constant-on-time pulse generators 400-1, . . . , 400-M depicted in FIG. 4. In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program. The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments which use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A constant-on-time pulse generator circuit for a DC-DC converter, the constant-on-time pulse generator circuit comprising:
 a plurality of serially connected digital buffers configured to delay a trigger signal for the constant-on-time pulse generator circuit with a predefined delay duration in response to a first control signal that is applied to each of the serially connected digital buffers, wherein the first control signal comprises a voltage signal or a current signal that is generated based on a master pulse signal from a master constant-on-time pulse generator circuit, and wherein at least one of the serially connected digital buffers comprises a Resistor-Capacitor (RC) network connected between two digital gates;
 a latch circuit having a set terminal, a reset terminal, and an output terminal, wherein the set terminal and the reset terminal are coupled to the serially connected digital buffers, and wherein the latch circuit is configured to output a pulse signal with a constant pulse width through the output terminal; and
 a controller configured to select an output of one of the serially connected digital buffers as an output of the serially connected digital buffers in response to a second control signal, wherein the second control signal comprises a digital signal.

2. The constant-on-time pulse generator circuit of claim 1, wherein the controller comprises a multiplexer configured to enable or disable one or more digital buffers of the digital buffers.

3. The constant-on-time pulse generator circuit of claim 2, wherein the controller further comprises a counter configured to generate a digital word, and wherein the multiplexer is further configured to enable or disable one or more digital buffers of the digital buffers based on the digital word.

4. The constant-on-time pulse generator circuit of claim 3, wherein the latch circuit is configured to receive the trigger signal at the set terminal and to receive the output of the serially connected digital buffers at the reset terminal.

5. The constant-on-time pulse generator circuit of claim 1, wherein the latch circuit is configured to receive the trigger signal for the constant-on-time pulse generator circuit and the output of the serially connected digital buffers.

6. The constant-on-time pulse generator circuit of claim 1, wherein the serially connected digital buffers are identical to each other.

7. A pulse width calibration circuit for a DC-DC converter, the pulse width calibration circuit comprising:
  a master constant-on-time pulse generator circuit configured to generate a pulse signal with a constant pulse width, wherein the master constant-on-time pulse generator circuit comprises a plurality of serially connected digital buffers configured to delay a trigger signal for the constant-on-time pulse generator circuit with a predefined delay duration in response to a first control signal that is applied to each of the serially connected digital buffers and a controller configured to select an output of one of the serially connected digital buffers as an output of the serially connected digital buffers in response to a second control signal, wherein the first control signal comprises a voltage signal or a current signal that is generated based on the pulse signal from the master constant-on-time pulse generator circuit, wherein the second control signal comprises a digital signal, and wherein at least one of the serially connected digital buffers comprises a Resistor-Capacitor (RC) network connected between two digital gates;
  a pulse width to voltage converter configured to generate an output voltage in response to the pulse signal;
  an amplifier configured to generate an amplified voltage in response to the output voltage; and
  a filter configured to perform signal filtering on the amplified voltage to generate a control voltage signal for the master constant-on-time pulse generator circuit in response to the amplified voltage.

8. The pulse width calibration circuit of claim 7, wherein the master constant-on-time pulse generator circuit further comprises:
  a latch circuit having a set terminal, a reset terminal, and an output terminal, wherein the set terminal and the reset terminal are coupled to the serially connected digital buffers, and wherein the latch circuit is configured to output the pulse signal with the constant pulse width through the output terminal.

9. The pulse width calibration circuit of claim 8, wherein the serially connected digital buffers are configured to delay the trigger signal with a predefined delay duration in response to the control voltage signal.

10. The pulse width calibration circuit of claim 8, wherein the latch circuit is configured to receive the trigger signal at the set terminal and to receive the output of the serially connected digital buffers at the reset terminal.

11. The pulse width calibration circuit of claim 8, wherein the serially connected digital buffers are identical to each other.

12. The pulse width calibration circuit of claim 7, wherein the amplifier is further configured to:
  compare the output voltage to a reference voltage; and
  generate the amplified voltage based on a difference between the output voltage and the reference voltage.

13. A method for operating a constant-on-time pulse generator circuit for a DC-DC converter, the method comprising:
  delaying a trigger signal using a plurality of serially connected digital buffers of the constant-on-time pulse generator circuit in response to a first control signal that is applied to each of the serially connected digital buffers, wherein the first control signal comprises a voltage signal or a current signal that is generated based on a master pulse signal from a master constant-on-time pulse generator circuit, wherein at least one of the serially connected digital buffers comprises a Resistor-Capacitor (RC) network connected between two digital gates, and wherein delaying the trigger signal using the serially connected digital buffers of the constant-on-time pulse generator circuit comprises selecting an output of one of the serially connected digital buffers as an output of the serially connected digital buffers in response to a second control signal, wherein the second control signal comprises a digital signal; and
  generating a pulse signal with a constant pulse width in response to the delayed trigger signal using a latch circuit of the constant-on-time pulse generator circuit.

14. The method of claim 13, wherein the latch circuit comprises a set terminal, a reset terminal, and an output terminal, and wherein the set terminal and the reset terminal are coupled to the serially connected digital buffers.

15. The method of claim 13, wherein selecting the output of the one of the serially connected digital buffers as the output of the serially connected digital buffers comprises:
  generating a digital word; and
  enabling or disabling one or more digital buffers of the digital buffers based on the digital word.

16. The method of claim 13, wherein the serially connected digital buffers are identical to each other.

* * * * *